(12) United States Patent
Richter et al.

(10) Patent No.: US 7,498,266 B2
(45) Date of Patent: Mar. 3, 2009

(54) METHOD FOR STRUCTURING OF SILICON SUBSTRATES FOR MICROSYSTEM TECHNOLOGICAL DEVICE ELEMENTS AND ASSOCIATED SILICON SUBSTRATE

(75) Inventors: Karola Richter, Dresden (DE); Daniel Fischer, Dresden (DE)

(73) Assignee: Technische Universität Dresden, Dresden (DE)

( * ) Notice: Subject to any disclaimer, the term of this patent is extended or adjusted under 35 U.S.C. 154(b) by 288 days.

(21) Appl. No.: 11/261,241

(22) Filed: Oct. 27, 2005

(65) Prior Publication Data

US 2006/0099811 A1    May 11, 2006

Related U.S. Application Data

(63) Continuation-in-part of application No. 10/553,728, filed as application No. PCT/DE2004/000804 on Apr. 15, 2004.

(30) Foreign Application Priority Data

Apr. 15, 2003    (DE) ................. 103 18 568

(51) Int. Cl.
  *H01L 21/461* (2006.01)
  *H01L 21/302* (2006.01)
(52) U.S. Cl. ................. 438/706; 438/707; 438/713; 438/714; 438/719
(58) Field of Classification Search .............. None
  See application file for complete search history.

(56) References Cited

U.S. PATENT DOCUMENTS 4,855,017 A    8/1989 Douglas (Continued)

FOREIGN PATENT DOCUMENTS

DE    4241045    5/1994

(Continued)

OTHER PUBLICATIONS

Volland B et al; "Dry etching with gas chopping without rippled sidewalls"; Journal of Vacuum Science & Technology; B: Microelectronics and Nanometer Structures; Nov. 1999 vol. 17, Issue 6, pp. 2768-2771.

(Continued)

*Primary Examiner*—Duy-Vu N Deo
(74) *Attorney, Agent, or Firm*—Horst M. Kasper (57) ABSTRACT

A method for structuring of silicon substrates for microsystem technological device elements, wherein the silicon substrate is covered with an etching mask and wherein the structures are furnished with a predetermined etching profile in the micrometer region with side walls and an etching depth At. For the generation of a predetermined positive etching profile, the side walls of the structures are furnished with the defined slope angle β of from 60 degrees to 88 degrees relative to the etching bottom and the structures are generated with an etching depth At in the micrometer region. Initially an isotropic etching is performed such that a mask under etching u is generated, wherein the mask under etching u is formed approximately equal to the etching depth At. In the following the etching depth At is increased by anisotropic etching in one process with alternatingly successively following etching and polymerization steps, such that the mask under etching u remains constant and such that the etching front of the etching profile obtains a new course, wherein the side walls of the structure are covered with a polymer.

7 Claims, 8 Drawing Sheets

U.S. PATENT DOCUMENTS

| | | | |
|---|---|---|---|
| 4,902,377 | A | 2/1990 | Berglund et al. |
| 6,180,466 | B1 | 1/2001 | Ibok |
| 6,198,150 | B1 | 3/2001 | Gelzinis |
| 6,235,643 | B1* | 5/2001 | Mui et al. .................... 438/719 |
| 6,931,619 | B2* | 8/2005 | Buxbaum et al. ............. 716/21 |
| 7,179,717 | B2* | 2/2007 | Sandhu et al. .............. 438/424 |
| 2002/0137355 | A1* | 9/2002 | Burke ......................... 438/713 |
| 2006/0219654 | A1 | 10/2006 | Richter |

FOREIGN PATENT DOCUMENTS

| | | |
|---|---|---|
| DE | 19736370 | 3/1999 |
| EP | 0822582 | 2/1998 |
| JP | 04028229 | 1/1992 |
| JP | 08186095 | 7/1996 |

OTHER PUBLICATIONS

J.P. John et al.; J. Electrochem Soc. vol. 140, No. 9 (1993) pp. 2622-2625.

H. Seidel et al.; J. Electrochem Soc. vol. 137, No. 11, Nov. 1990, pp. 3612-3632.

B. Kim et al.; J. Electrochem. Soc. vol. 145, No. 7 Jul. 1998, pp. 2498-2508.

J. W. Rangelow et al.; J. Vac. Sci. Technol, B 13(6) Nov./Dec. 1995, pp. 2394-2399.

K. M. Chang et al; Journal of Applied Physics, Sep. 1, 1996, vol. 80, Issue 5, pp. 3048-3055.

Aachboun et al, "Deep Anisotropic Etching of Silicon"; J. Vac. Sci. Technol. A 17 (4), Jul./Aug. 1999; pp. 2270-2273.

Ayon et al.; "Application of the Footing Effect in the Micromachining . . ." J. Vac. Sci. Technol. A 17(4), Jul./Aug. 1999; pp. 2274-2279.

Zijlstra et al. "Fabrication of Two-Dimensional Photonic Crystal Wave-Guides . . ." J. Vac. Sci. Technol. B 17(6) Nov./Dec. 1999 pp. 2734-2739.

Micromachining and Microfabrication Process Technology SPIE, vol. 2639, Bhavoway et al, "Advanced Silicon Etching Using High Density Plasms" pp. 224-233.

John et al. "Spray Etching of Silicon in . . ." J. Electrochem. Soc., vol. 140, No. 9, Sep. 1993 pp. 2622-2625.

Seidel et al. "Anisotropic Etching of Crystalline Silicon . . ." J. Electrochem. Soc., vol. 137, No. 11, Nov. 1990 pp. 3612-3625.

Kim et al, "Aqueous KOH Etching of Silicon . . ." J. Electrochem. Soc., vol. 145, No. 7, Jul. 1998, pp. 2499-2508.

Rangelow et al, "Reactive Ion Etching for Microelectrical . . ." J. Vac. Sci. Technol, B 13(6) Nov./Dec. 1995 pp. 2394-2399.

Volland et al, "Dry Etching With Gas Chopping . . ." J. Vac. Sci. Technol. B 17(6) Nov./Dec. 1999 pp. 2768-2771.

Chang et al, "Highly Selective Etching for Polysilicon . . ." J. Appl. Phys. 80 (5), Sep. 1, 1996 pp. 3048-3055.

\* cited by examiner

Fig. 1

Stand der Technik

Fig. 2

Stand der Technik

Stand der Technik

METHOD FOR STRUCTURING OF SILICON SUBSTRATES FOR MICROSYSTEM TECHNOLOGICAL DEVICE ELEMENTS AND ASSOCIATED SILICON SUBSTRATE

CROSS REFERENCE TO RELATED APPLICATIONS

This application is a continuation-in-part application of pplication Ser. No. 10/553,728, which is a PCT-application which entered the United States national phase on Oct. 14, 2005, which entry was completed Jan. 3, 2006. The PCT-application carried application number; PCT/DE2004/000804 and was filed on Apr. 15, 2004. Priority is claimed based on German Patent Application 103 18 568.2 filed on Apr. 15, 2003.

TECHNICAL FIELD OF THE INVENTION

The Invention relates to method for the structuring of silicon substrates for microsystem technical devices, wherein the silicon substrate is covered with an etching mask and wherein the structures are furnished with a predetermined positive etching profile in the micrometer region with side walls and an etching depth At, as well as on associated silicon substrate. The microsystem technological device elements include micro-electromechanical systems (MEMS), microfluidic devices and casting masters.

The following structural dimensions of the silicon substrates are essential for the micro systems technology: the lateral extension of the etching amounts to starting with about 10 micrometers up to several millimeters and up to a large area abrasion of surfaces of a silicon wafer. Here the vertical etching depth directed into the silicon amounts to from 10 micrometers to about 500 micrometers and more, wherein also a complete etching through of a silicon substrate in the shape of a silicon wafer of several hundred micrometers thickness can be performed.

The following can be generated with this method:
silicon casting molds or silicon embossing tools for the production of polymer mold parts
micro-fluid devices with channel systems and nozzles
devices of power electronics with trench structures
special bridge structures for devices of the electron microscopy or the like.

Numerous devices of the micro-system technology are produced on the basis of structured silicon substrates. This concerns in particular devices of the micro-mechanics field, the micro-fluidic field and the power electronics field. The process of silicon structuring is an important aspect in connection with the production of components.

The processing of silicon substrates in the micrometer region for the micro-system technology is distinguished from the usual silicon substrates, usual in the semiconductor technology, which substrates exhibit etching structures disposed in the nano meter region.

BACKGROUND OF THE INVENTION

Conventional methods for the production of silicon substrates for semiconductor technical devices and associated silicon substrates are described in the following, wherein the silicon substrates are processed with etching procedures.

The U.S. Pat. Nos. 6,198,150 A and 6,180,466 B1 describe silicon substrates for semiconductor technological devices, and wherein the structures of the silicon substrates are furnished with a positive profile having a determined slope angle and are covered with a mask, wherein the structures include an upper part, which includes a mask under etching, where the depth of the mask under etching is approximately equal to the lateral dimension, and the residual part, wherein side walls are present with a defined slope angle. Furthermore the production of shallow trench isolation structures is described in the U.S. Pat. No. 6,180,466 B1, wherein the structures are employed in the semiconductor industry in connection with the production of ULSI semiconductor devices. Here highest integrated circuits are of concern, wherein the packing density of the active regions on the chip is constantly increased up to the limits of the presently produceable structures by advancing minimization of the vertical and of the lateral dimensions of the structures and the further development of electronic semiconductor elements is advanced. The dimensions of the structures are in the sub micrometer region, typically in the nano meter region of up from 180 to 250 nano meters. The wet chemical etching of silicon substrates is described in the document J. P. John et al.: Journal electrochemical society, volume 140, No. 9 (1993), 2622-2625. For example mixtures of nitric acid ($HNO_3$), fluoric acid (HF) and water can be employed for this purpose. The etching process runs completely isotropic in this case, that is the mask under etching is nearly as large as the etching depth. Limits for the application of this method result from the advancing minimization of the lateral structural dimensions, which minimization results from the requirement of increasing miniaturerization of the device elements of the microsystem technology.

An aniso-tropic wet chemical structuring of silicon according to H. Seidel, L. Csepregi, A. Heuberger, H. Baumgaertel: Journal electrochemical society, volume 137, No. 11, Nov. 1990, 3612-3632,4, respectively, B. Kim, D. D. Cho: Journal electrochemical society, volume 145, No. 7, Jul. 1998, 2499-2508 is possible by employment of an alkaline etching solution preferring directions, such as potassium hydroxide, lithium hydroxide, or sodium hydroxide. The non iso-tropic character of the etching is based on the different dissolution speeds of the silicon in the various crystal planes. The <111>-plane is most slowly abraded and therefore operates as a structural limitation. During etching of <100>-silicon thus there result frustrated pyramid like recesses where the (111)-faces form the structural walls with a defined angle of 54.74 degrees. With a structural width $b_M$ in the etching mask, there can be achieved a maximum etching depth $A_t$ of $$A_t = \frac{b_M}{\sqrt{2}}$$

Since the position of the crystal planes is fixed according to angle and grid, the realization possibilities for microstructures are substantially limited relative to lateral shape and cross-sectional shape of the etched trenches.

Various plasma supported silicon etching processes have been developed in connection with the quick development of semiconductor technology. A multitude of possible plant concepts for plasma etching plants and a multitude of process parameters enable the variation of the etching processes over a wide region. The plasma etching processes are associated in principle and in particular with the advantage, that an aniso-tropic structuring is possible independent of the crystal orientation.

Plasmachemical silicon etching processes which in most cases are based on fluorine chemistry are described for example in the printed document H. von Boenig: Fundamentals of plasma chemistry and technology, p. 174, The research Institute of plasma chemistry and technology Carlsbad, Calif.

If silicon is for example etched in pure SF6 plasma or (SF6: sulfur hexa fluoride) this process usually runs isotropic, sets that the mask under etching u is approximately equal to the etching depth At.

An anisotropy of the etching process can be obtained in the following way amongst others:

A method under employing of chlorine, bromine, and fluorine chemistry is described in the printed document I. W. Ragelow, H. Loeschner: journal vacuum science and technology, B 13 (6), November/December 1995, 2394-2399 and K.-M. Chang ,T.-H. Yeh, I.-C. Deng, H.-C. Lin: journal of applied physics—Sep. 1, 1996, volume 80, issue 5, 3048-3055, wherein the lateral etching by side wall passivation is prevented. For this purpose the composition of the etching gas is adjusted such that during the etching process also such chemical reactions occur which reactions lead to the covering of the side walls with etch resistant layers.

The high expenditure for the safety technology as well as the gas supply and gas discharge for assuring environmental compatibility is a problem of this method.

A further method under employing of fluorine chemistry in connection with oxygen is described in I. W. Rangelow, H. Loeschner: Journal vacuum science and technology, B 13 (6), Nov. /Dec. 1995, 2394 2399, wherein a mixture of SF6 and oxygen is employed as an etching gas. The silicon reacts with the oxygen species to $SiO_x$ in the structures. The oxygen layer is quick to be again removed at the floor by fluorine radicals supported by ion impact as compared with the side walls, such that the etching process obtains a preferred direction. An optimum ratio between sufficient side wall passivation and high etching speed is very difficult to adjust. The control of the passivation limits the achievable etching depth.

Another method employing cryogenic processes in connection with SF6/O2 chemistry is described in the printed document I. W. Ragelow, H. Loeschner: journal vacuum science and technology, B 13 (6), Nov. /Dec. 1995, 2394-2399, wherein a high concentration of reactive etching species is the precondition to obtain high etching speeds. In this case however, a more intense etching attack occurs also on the side walls. The probability of spontaneous reactions between silicon and fluorine at the side walls is reduced drastically by cooling of the substrates to temperatures of about −110 degrees centigrade. The lateral etching rate decreases together with the chemical reaction rate. However, an intensive ion impact occurs at the floor of the structures. This intensive ion impact generates radical places and excites reactive particles such that chemical reactions occur furthermore. A clearly increased vertical etching rate results therefrom.

The methods for etching described in the printed documents U.S. Pat. Nos. 4,902,377, 4,855,017 as well as JP 08-186095 A and JP 04-0282229 A have been developed for the generation of sub micrometer structures with a positive etching profile. The thickness of the structures amounts to at most one micrometer and a rounded off profile with otherwise vertical side walls results.

Technological solutions have been worked out for this application region and also process parameters have been optimized. The methods are suitable for example for the contact hole etching. In fact positive etching profiles of the recited order of magnitude can be generated with this method however this is not the case for larger etching depths.

The described methods cannot be applied for device elements of the microsystem technology, since the structural dimensions in the micro-system technology are by one to two orders of magnitude larger. In this case the etching rates of the recited etch processes are much too low and the influence of the indicated process modifications or process combinations can be neglected with respect to the resulting etching product.

All recited methods are referring to the nano meter region, which nano meter region plays a particular important role in the semiconductor industry. A simple taking over of the described etching processes into the micrometer region for microsystem technological device elements, in particular in the region of about 10 micrometers to about 500 micrometers cannot be achieved. In addition the structural dimensions in the microsystem technology are by two to three orders of magnitude larger as in the semiconductor technology for the production of microelectronic device elements.

Based on the fact that etching processes of the semiconductor technological methods for the structuring of silicon substrates in the nano meter regions cannot be taken over in a simple way to the micrometer region for structuring of microsystem technological device elements, a further developed etching process (advanced silicon etch process—ASE-process) is described in the printed patent document DE 4241045 C 1 for larger, in the micrometer region etchable and suitable silicon substrates with structures in the micrometer region, wherein a cyclical process for the - generation of structures with vertical side walls is performed, which process is composed out of alternating deposition steps and etching steps in the kind of intervals. During the intervals of deposition a passivation of the complete substrates surface occurs by the deposition of a polymer layer. 4241045 C1 for larger, in the micrometer region etchable and suitable silicon substrates with structures in the micrometer region, wherein a cyclical process for the generation of structures with vertical side walls is performed, which process is composed out of alternating deposition steps and etching steps in the kind of intervals. During the intervals of deposition a passivation of the complete substrates surface occurs by the deposition of a polymer layer.

A problem comprises that during the etch interval, the polymer layer is removed on all horizontal planes by ion impact. The silicon laid bare reacts with fluorine to volatile reaction products at the floor of the structures. The covering with a polymer at the vertical side walls remains intact. The horizontal layer disposed in the depth and furnished with the polymer is freed from the polymer by ion impact, such that the next etching step produces an advancing etching depth At.

A problem comprises that the wall roughness of the etched structures is fairly high. Etching depths At in the order of magnitude of microsystem technological device elements, however the side walls of the etching profile as pregiven, remain formed vertically.

Essential features of the ASE process include:
realization of etching depth of from 10 to 500 micrometer
achievable aspect ratio: larger than 25
slope angle in the side walls: 90 degrees or very nearly 90 degrees
mask under etching is not present or approaches zero
arbitrary lateral shape of the structures (for example channel structures, passage holes through the silicon wafer, comb like structures, grid structures) can be realized
application of conventional etching masks (for example $SiO_2$, photo resist)
etching rate: three to five micrometers per minute In order to decrease the wall roughness of the generated side walls there is described as a further development a method for the plasma etching for generation of etching profiles in silicon substrates in the printed document of B. Volland et al., Journal of Vacuum Science and Technology B, Microelectronics proceedings and phenomena volume 17

No. 6 Nov. and 1999, pp. 2768 - 2771, wherein the silicon substrate is covered with a mask and the following steps are performed:

the isotropic etching according to the method of the printed document DE 4241045 C 1 is substituted by an anisotropic etching step, an anisotropic etching with alternatingly following successively polymerisation steps in a C4F8 plasma and etching steps in the SF6 plasma such that the etching depth At with constant mask under etching u is enlarged and the side walls of the structure are covered with a polymer, as well as repetitions of the preceding steps until the predetermined etching profile is generated.

Figure 2:
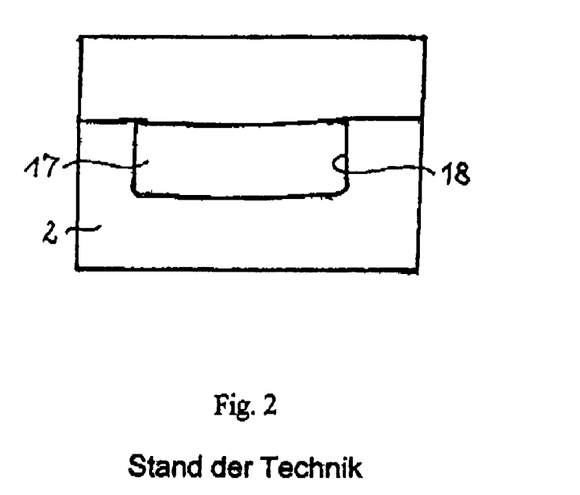

The removal of the polymer from the floor of the etching front and in part from the side walls of the etch structure is performed with each of the SF6 plasma steps. The problem comprises that undesired deviations of the etching profile as is shown in FIG. 2 occur during etching of structures with high aspect ratios, which corresponds to the quotient between etching depth and structural breadth.

Here also regions with slightly negative and slightly positive etching profiles can be generated, which etching profiles deviate from the predetermined etching profiles with the desired vertical side walls. Amongst others the following causes exist for this:

the regions with positive etching profile are generated here at large etching depth in narrow trenches through
    shading effects for the arriving ions,
    problems at the discharge transport of the etching species and the discharge transport of reaction products
    ion straying and ion braking and deceleration.

The regions with a negative etching profile are generated by:
    deflection of ions in the direction of the side walls in the middle region, whereby an increased attack of the passivation layer is present at the side walls, and
    the deflection of ions in the direction of the side walls based on the changed electrical field at the mask edges present below the etching mask.

The recited problems depend on the layouts and on the etching depth and are by no means desired. In addition, the positive regions and the negative regions of the etching profiles cannot be adjusted independently from each other.

On the contrary, in order to be able to oppose angle deviations from the desired vertical side walls and in order to control the generation of vertical side walls, the method has been optimized.

Figure 1:
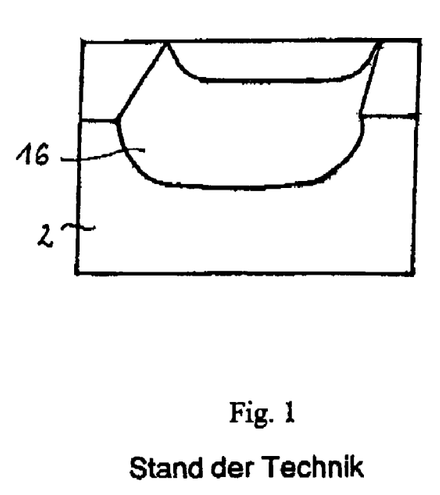
FIG. 1 a conventional structure with an isotropic etching process in a pure SF6 plasma FIG. 2 a structure generated by way of a process corresponding to the state-of-the-art and to the printed patent document DE 4241045 C 1, FIG. 3 a predetermined positive etching profile with the defined sloping angle beta according to the present Invention, FIG. 4 a schematic construction of a plasma etching plant according to the state-of-the-art, FIG. 5 an unprocessed silicon wafer with an etching mask out of SiO2, FIG. 6 a processed silicon wafer with an etching mask out of SiO2 as a result of the isotropic etching in a pure SF6-plasma, FIG. 7 a processed silicon wafer within etching mask out of SiO2 as a result of an isotropic etching successively followed by an isotropic etching with an etching depth At, with a mask under etching u and with an etching front, FIG. 8 a processed silicon wafer with an etching mask out of SiO2 after laying bare of the side walls of the etched structure furnished with a polymer coating by way of an O2-plasma, FIG. 9 a presentation of the dependence of the slope angle of the edge structure from the time ratio Z FIG. 10 a structure with a slope angle $\beta$=89 degrees, etched at Z=0.1

Based on the present state of the art it has to be determined that presently hardly any technological possibilities exist for varying the etching profile in the silicon structuring. These possibilities are limited essentially to the following two variations:

a) completely iso-tropic etching (for example by way of $SF_6$-plasma) as illustrated in FIG. 1 as a conventional structure.

b) Etching for realization of silicon structures with completely vertical side walls having mask under etchings close to zero as are shown in FIG. 2 according to the printed document DE 4241045 C1 and the printed document of B. Volland et al., Journal of Vacuum Science and Technology B, Microelectronics proceedings and phenomena volume 17 No. 6, November 1999, pp. 2768-2771.

A decisive problem of all silicon substrates with etching profiles with vertical side bowls and negative etching profiles with divergence side walls within the silicon substrate comprise that the release of mold cast parts disposed in the etching profile is difficult or, respectively, not possible.

DESCRIPTION OF THE INVENTION

Therefore the object of the Invention comprises to disclose a method for structuring of silicon substrates for microsystem technological device elements and an associated silicon substrate, which are formed such that silicon substrates in a micro meter region of 10 µm to 500 µm and more with preselected positive etching profiles and with side walls converging in the silicon substrate and wherein an easy release of mold cast parts from the etched silicon substrates can be assured. In addition the surface roughness is to be minimized in the etched structures, in particular at the side walls.

According to the present Invention the object is achieved with the silicon substrate with the features stated in claims 1 and 8.

In the method for structuring of silicon substrates for microsystem technological device elements, wherein the silicon substrate is covered by an etching mask and wherein structures are furnished with a predetermined etching profile in the micrometer region with side walls and an etching depth At, according to the patent claim 1 for the generation of a predetermined positive etching profile, the side walls of the structures are furnished with the defined slope angle β of from 60 degrees to 88 degrees relative to the etching bottom and the structures are generated with an etching depth At in the micrometer region, wherein a) initially an isotropic etching is performed such that a mask under etching u is generated, wherein the mask under etching u is formed approximately equal to the etching depth At, b) in the following the etching depth At is increased by anisotropic etching in one process with alternatingly successively following etching and polymerization steps, such that the mask under etching u remains constant and such that the etching front of the etching profile obtains a new course, wherein the side walls of the structure are covered with a polymer, c) whereupon the polymer is removed at the side walls of the structure with an O2-plasma, and d) the isotropic etching of the step a), the anisotropic etching of the step b) and the removal of the polymer of the step c) are repeated as many times until the predetermined positive etching profile is obtained, e) wherein the slope angle beta is determined in a positive etching profile by adjustment of a time ratio Z according to the equation $$Z = \frac{t_{isotropic}}{t_{anisotropic}}$$

between the steps of the isotropic etching according to step a) and the steps of the anisotropic etching according to step b) is determined, wherein $t_{iso\text{-}tropic}$ represents the interval period of the isotropic etching step a) and wherein $t_{anisotropic}$ represents the interval period of the anisotropic etching step b).

Here the structures of the silicon substrate can be for etching in the micrometer region with an etching depth At of from 10 micrometers to 500 micrometers and more.

In order to accomplish this the silicon substrate can be initially iso-tropically etched in a SF6-plasma.

The increase of the etching depth At is performed by an anisotropic etching process, wherein the process gas pressures and the constant interval times are decreased. Here the pressures for the process gases can as desired be 1.0 to 5.3 Pa and the interval times 3 to 12 seconds.

The step of the enlargement of the etching depth At by anisotropic etching with alternatingly successively following etching steps and polymerization steps, such that the mask under etching u remains constant and such that the etching front of the etching profile obtains a new course, wherein the side walls of the structure are covered with a polymer, can be time wise enlarged and therefrom the time ratio Z can be determined, which time ratio Z is coordinated to the defined slope angle beta.

Also the step of the isotropic etching, with which the mask under etching u is generated, which mask under etching is formed approximately equal to the etching depth At, can be extended time wise and the time ratio Z can be there from determined, which time ratio is coordinated to the defined slope angle beta.

In the silicon substrate with the structure, which is furnished with a predefined positive etching profile with side walls and an etching depth At, and which is produced by way of the above recited Invention method, they are the side walls of the structures with a defined sloping angle beta of from 60 degrees to 88 degrees adjusted relative to the etching bottom and wherein the structures exhibit an etching depth in the micrometer region and in particular from 10 micrometers to about 500 micrometers, wherein the slope angle beta in the positive etching profile is furnished and preset by adjustment of a time ratio Z according to the equation $$Z = \frac{t_{isotropic}}{t_{anisotropic}} =$$

Time of the isotropic etching/time of the anisotropic etching between the step of the isotropic etching a) and the step of the an isotropic etching b), wherein $t_{isotropic}$ represents the interval duration of the isotropic etching step a) and wherein $t_{anisotropic}$ represents the interval duration of the an isotropic etching step b).

The method according to the present Invention is a plasma etching process (PPE-process - positive profile etching process) which allows to structure silicon substrates such that thereby positive etching profiles are generated. The slope angle of the side walls of the etched structures can be defined adjusted in the region between 60 degrees and 88 degrees by suitable selection of the process parameters. Etching rates of three to five micrometers per minute and etching depth up to 500 μm can be obtained depending on the aspect ratio, on the opened (that is to be etched) face and on the process variation. A limitation of the reachable etching depth results only from the standing time of the etching masks, however not from process associated parameters.

DETAILED DESCRIPTION IN CONNECTION WITH THE DRAWINGS

The Invention is in the following illustrated in more detail by way of embodiment examples. There is shown in the drawings.

FIGS. 1 and 2 serve to illustrate the state-of-the-art. FIG. 1 shows the silicon substrate 2 with a conventional structure 16 as an etching profile after an isotopic etching process in pure SF6-plasma. FIG. 2 shows a structure generated by way of the isotopic etching process according to the German printed patent document DE 4241045 C1.

Figure 3:
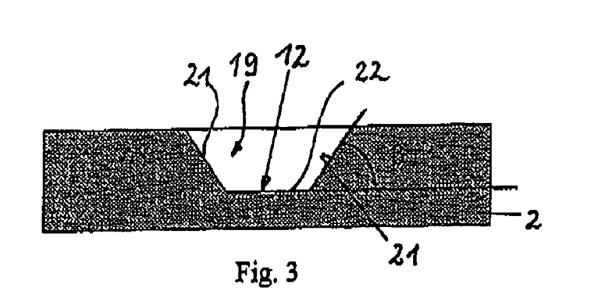

FIG. 3 shows schematically the desired positive etched profile with the illustrated slope angle $\beta$, wherein inclined converging side walls 21 and an etching bottom 22 are present as an etching front 12.

A plasma etching plant of the company Surface Technology Systems Ltd. (STS), Great Britain is suitable for performing the structuring of the silicon substrate according to the present Invention as illustrated in FIG. 3. Such a plant is the schematically illustrated in FIG. 4.

Figure 4:
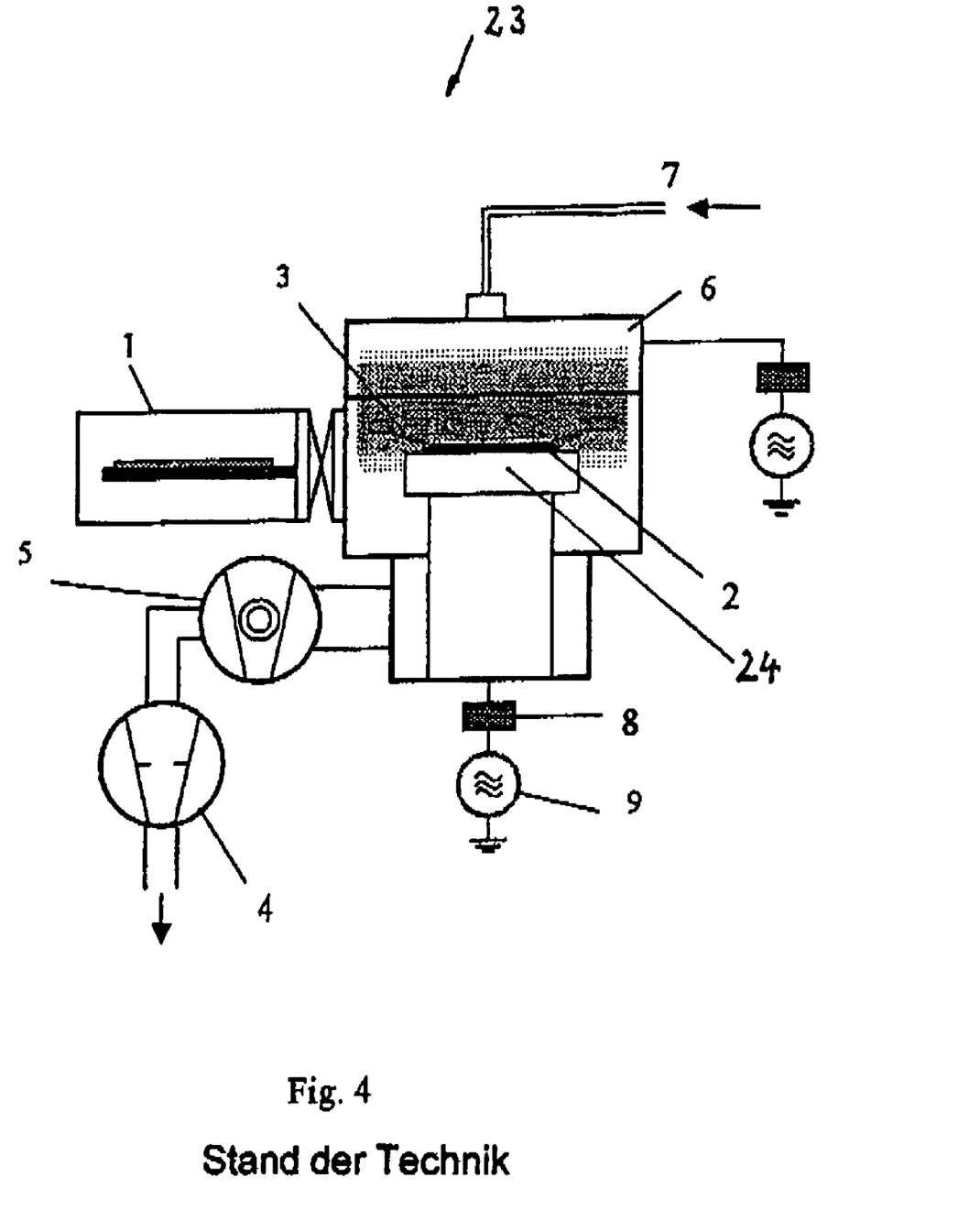

4" or 6" silicon wafers can be processed in this plant. Wafers are fed in the plasma reactor through a sluice (or load lock) 1. The silicon wafers are held by a mechanical clamping 3 on the substrate electrode and are cooled by way of helium backside cooling. A pump system comprising a rotary slider pump 4 and a turbo molecular pump 5 is furnished for vacuum generation. The pressure of the process gas can be set in the range of 1 to 15 Pa. Nitrogen (N$_2$), oxygen (O$_2$), argon (Ar), tetra fluoro methane (CF$_4$), sulfur hexa fluoride (SF$_6$) and octa fluoro cyclo butane (C$_4$F$_8$) can be fed in as process gases through a gas inlet port 7. A main component of the plant is the ICP-plasma source 6, supplying a plasma of high density. A high frequency power of maximum one kilo Watt can be coupled into the ICP- plasma source 6. The substrate electrode is capable of being biased and be charged with a high frequency power of maximum 300 watts. A matching unit 8 and a high frequency generated 9 are furnished for this purpose. In each case the frequency amounts to 13.56 MHz. The performance of cyclical processes is possible at the plant.

The measurement of etching depth can be performed with the aid of a surface profile meter of the company TENCOR INSTRUMENTS with an accuracy of plus minus 5 nm.

The method according to the present Invention for structuring of silicon substrates for microsystem technological device elements is essentially explained by way of the FIGS. 5 through 8, and wherein the silicon substrate 2 is covered with an etching mask 10 and wherein the structures are created with a predetermined etching profile in the micrometer region with side walls and an etching depth At, and the Invention method shows thus the following further course steps:

The side walls 21 of the structures are furnished with a defined sloping angle beta of from 60 degrees to 88 degrees relative to the etching bottom 22 for generating of a predetermined positive etching profile 19 as illustrated in FIG. 3 and wherein the structures are generated with an etching depth At in the micrometer region from 10 micrometers to 500 micrometers and more, wherein a) initially an isotropic etching is performed with SF6-plasma 25 such that a mask under etching u is produced, wherein the mask under etching u is formed approximately equal to the etching depth At, b) in the following the etching depth At is enlarged by afiisetrepie anisotropic etching with altematingly successively following etching steps and polymerization steps, such that the mask under etching u remains constant and the etching front of the etching profile obtains a new course, wherein the side walls 21 of the structure are covered with a polymer 11, c) c) thereupon the polymer 11 is removed at the side walls 21 of the structure by way of an 02-plasma 27, and d) the isotropic etching of the step a), the anisotropic etching of the step b), and the removal of the polymer 11 of the step c) are repeated as many times until the predetermined positive etching profile 19 is obtained, wherein the renewed starting with the isotropic etching step also leads to the carrying away of silicon from the side walls 21 and extends the lateral dimensions of the structure in particular in the upper region, such that the predetermined slope angle beta is generated with advancing etching depth At depending on how the steps a) and b) are time wise tuned to each other, e) wherein the slope angle beta in the positive etching profile 19 is determined by adjustment of a time ratio Z according to the equation $$Z = \frac{t_{isotropic}}{t_{anisotropic}}$$

between the steps of the isotropic etching according to step a) and the step of the anisotropic etching according to step b), wherein $t_{isotropic}$ represents the interval duration of the isotropic etching step a) and wherein $t_{anisotropic}$ represents the interval duration of the $_{anisotropic}$ etching step b).

The method according to the present Invention, the so-called PPE-process is performed cyclically. The method is composed out of three steps, wherein the three steps are repeated always in the same sequence. The method exhibits the following course.

The silicon substrate 2 is isotropic etched in an SF6-plasma 25 in the shape of a reactive ionic etching.

The enlargement of the etching depth At is performed by way of in anisotronic etching process, wherein the pressures for the process gases amounts to 1.0 to 5.3 Pa and wherein the interval times amounts to 3 to 12 seconds.

Here the steps a) and b) are performed with alternating deposition an etching steps SF6-plasma and C4F8-plasma 26.

The step of the enlargement of the etching depth At by anisotropic etching with alternatingly sequentially following etching steps and polymerization steps can be time wise expanded for reaching of a predetermined positive etching profile 19, wherein the mask under etching u remains constant and the etching front 12 of the etching profile 19 obtains a new course and wherein the side walls 21 of the structure are covered with a polymer 11 and wherein time ratio Z is determined therefrom. The slope angle beta can be determined from the time ratio Z.

Here also the step a) of the isotropic etching, in connection with which the mask under etching u is generated, wherein the mask under etching u is formed approximately equal to the etching depth At, can be extended in time and the time ratio Z can be determined therefrom. The slope angle beta can be determined as above from the time ratio Z.

The therewith generated and produced silicon substrate 2 for microsystem technical device elements exhibits a structure, wherein the structure is furnished with a predetermined etching profile in the micrometer region with converging side walls in a silicon substrate and with an etching depth At, wherein the structure is produced with the Invention method, wherein the structure exhibits a predetermined positive etching profile 19, wherein the side walls 21 of the etching profile 19 are furnished with a defined slope angle beta of from 60 degrees to 88 degrees aligned parallel to the etching bottom and wherein the structures exhibit an etching depth At in the micrometer region from 10 micrometers to about 500 micrometers, wherein the slope angle beta in the positive etching profile is predetermined by setting of a time ratio Z according to the equation $$Z = \frac{t_{isotropic}}{t_{anisotropic}} =$$

Time of the isotropic etching/time of the anisotropic etching between the time of the isotropic etching and the time of the an isotropic etching. Here $t_{isotropic}$ represents the interval duration for the isotropic etching step and $t_{anisotropic}$ represents the interval duration for an isotropic etching step.

A defined variation of the slope angle beta is assured based on the time ratio Z.

Figure 5:
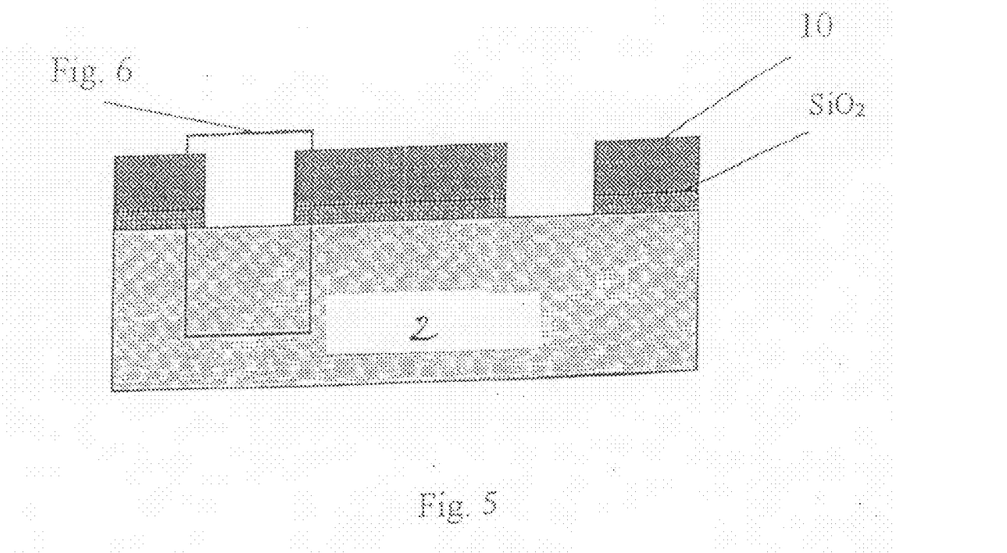

It is noted in advance that the silicon substrate 2 is furnished with an etching mask 10 as shown in FIG. 5. In this context mask materials such as photo resist, thermal silicon dioxide (SiO2), photo resist and SiO2 combined, as well as metal masks out of aluminum or copper.

Figure 6:
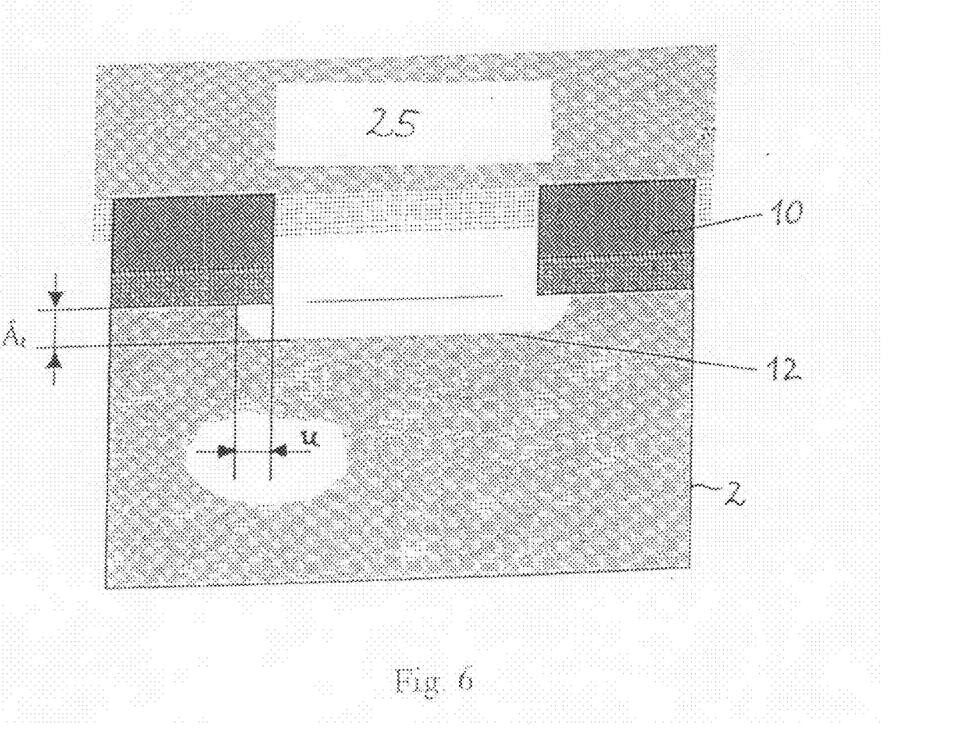

According to a first step the silicon substrate is isetrepieally isotropically etched in a pure SF$_6$ - plasma according to the representation shown in FIG. 6. With this etching step the mask under etching u is approximately equal to the etching depth $A_t$.

Figure 7:
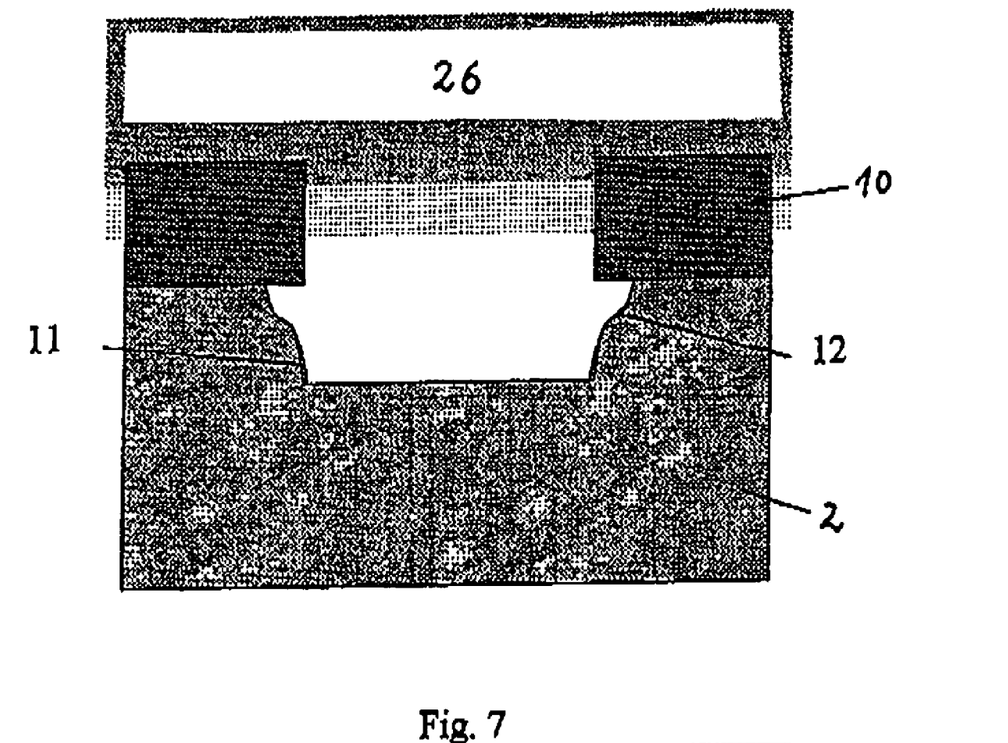

According to a second step the silicon substrate is subjected to a modified ASE-process as shown in FIG. 7. The etching depth At is increased but the mask under etching remains constant, and the etching front obtains a new course 12. The side walls of the structures are covered with a polymer according to the process of the printed document DE 42 41 045 C1.

Figure 8:
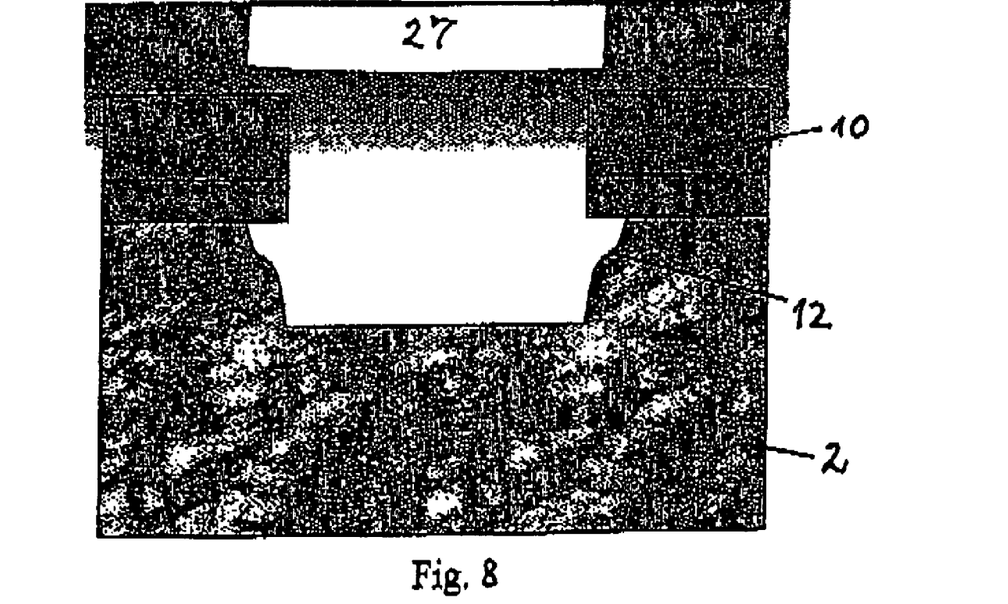

The polymer 11 at the side walls 21 of the structure is removed by an O2-plasma and an edge structure as in FIG. 8 is obtained according to the third step c) and in contrast to the method according to the German printed patent document DE 4241045 C1.

The method steps a), b), and c) are now repeated so many times until the desired etching depth has been reached. By superposition of the etching fronts, which result from the two silicon etching processes according to the steps a) and b), there are generated positive etching profiles with a slope angle between 60 degrees and 88 degrees.

The process parameters for each interval of the Invention method are contained in table 1. During step a) the iso-tropic silicon etching occurs, wherein 130 sccm SF6 serve as a process gas, wherein a process pressure of form about 2 to 10 Pa and preferably 4 Pa, an ICP power of form about 400 to 1000 W and preferably 600 W and a high frequency power at the substrate electrodes 24 of from 5 to 20 W and preferably 12 W are set as process parameters. The vertical silicon etching is indicated at step b) with the polymer deposition and the silicon etching with the resulting interval time of 5 seconds for the polymer deposition and the interval time 8 seconds for the silicon etching. The polymer removal with O2-plasma 27 according to step c) opens the possibility in each case, to increase in the etching depth At and to decrease the slope angle beta and to hold the wall roughness to a minimum.

The parameters of the Invention method of the corresponding step b) are compared in Table 2 with those parameters of the conventional method according to the German printed patent document DE 4241045 C1. In case of a decreased process gas pressure (1.3 Pa for the polymer deposition and 2.7 Pa during aniso-tropic silicon etching as opposed to 2.7 Pa for the polymer deposition and 5.3 Pa during anisotropic silicon etching) there are selected substantially smaller interval times (5 seconds for the polymer deposition and eight seconds for the an isotropic silicon etching) for each interval according to the present Invention method in order to obtain converging sloped side walls 21 deviating from the vertical line.

Inclined side walls 21 obtained by the essential decrease of the constant interval times.

The reproduceable setting of a predetermined slope angle beta is possible by selection of a coordinated time ratio Z with $$Z = \frac{t_{isotropic}}{t_{anisotropic}}$$

for the steps a) and b).

Figure 9:
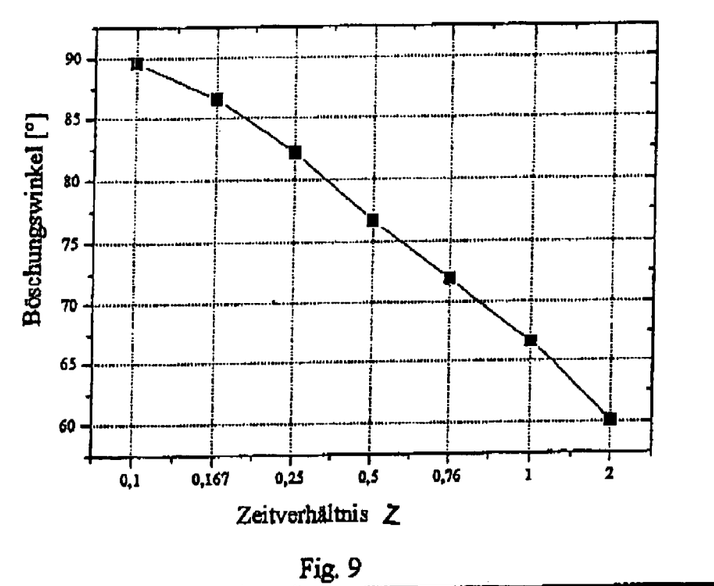
Figure 10:
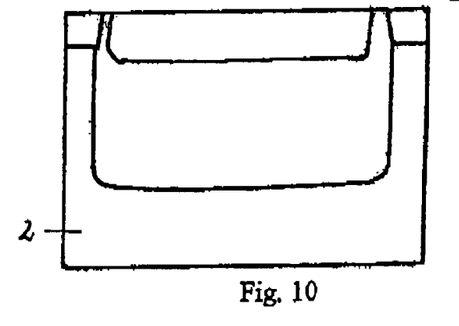
Figure 11:
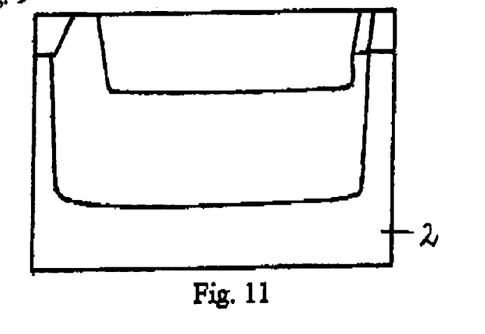
FIG. 11 a structure with a slope angle $\beta$=85 degrees, etched at Z=0.167
Figure 12:
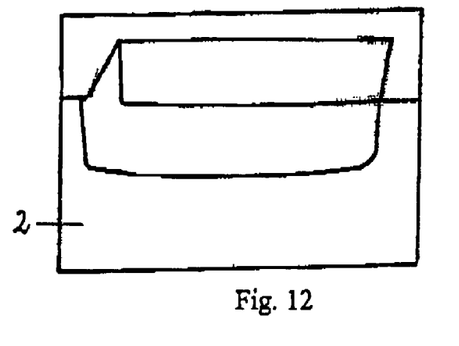
FIG. 12 a structure with a slope angle $\beta$=83 degrees, etched at Z=0.25
Figure 13:
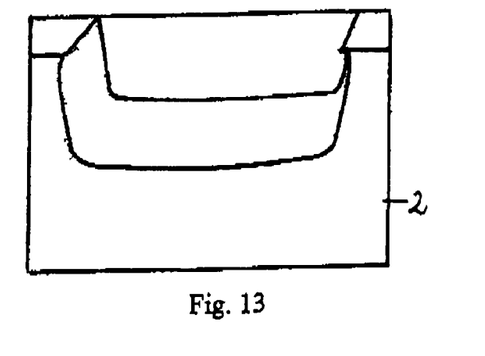
FIG. 13 a structure with a slope angle $\beta$=81 degrees, etched at Z=0.33
Figure 14:
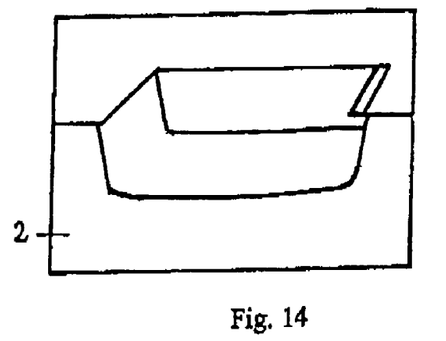
FIG. 14 a structure with a slope angle $\beta$=77 degrees, etched at Z=0.5
Figure 15:
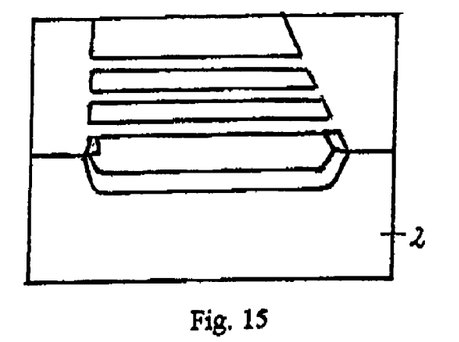
FIG. 15 a structure with a slope angle $\beta$=74 degrees, etched at Z=0.67
Figure 16:
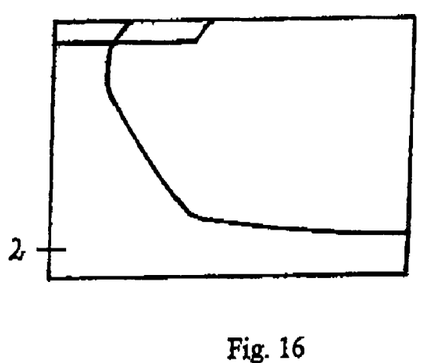
FIG. 16 a structure with a slope angle $\beta$=66 degrees, etched at Z=1
Figure 17:
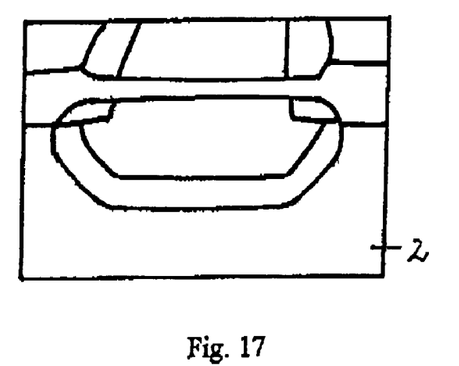
FIG. 17 a structure with a slope angle $\beta$=60 degrees, etched at Z=2

The larger the time parts of the isotropic etching in pure SF6-plasma becomes, the smaller will be the slope angle beta. FIG. 9 shows the relationship between the time ratio Z as a quotient of the time duration $t_{isotropic}$ of the silicon etching and the time duration $t_{isotropic}$ of the anisotropic silicon etching. With rising time ratio Z of the Invention method, the slope angle beta coordinated in each case to the side walls sinks and changes its value from 88 degrees downward in the direction 60 degrees. Schematic presentations for real structures with the decreasing sloping angle beta are shown in FIGS. 10 to 17, which sloping angles beta were correspondingly etched It is an advantage in connection with the formation of a predetermined positive etching profile that the defined variation of the sloping angle beta can be achieved by variation of the time ratio Z.

In the following embodiment examples for application of the structured silicon substrates produced by the Invention method are presented.

Embodiment Example 1

Figure 18:
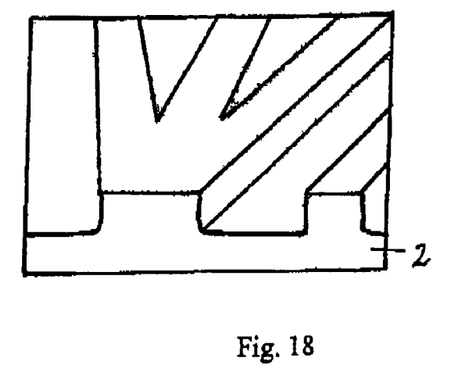
FIG. 18 an embossing tool out of silicon

The structural silicon substrates produced according to the present Invention can be employed as a mold for casting or stamping of device parts made out of polymers or other castable or moldable materials. The result of the silicon structuring is of decisive importance for the separability of the cast mold parts from the form presented by the structured silicon substrate. Sloping angles beta of the side walls <90 degrees alleviate the removal of the molded parts substantially. FIG. 18 shows a schematic representation of a silicon structure having a slope angle beta of 88 degrees, which is suitable as a stamping tool for production of polymer parts with trench structures for the medical technology.

Embodiment 2

Figure 19:
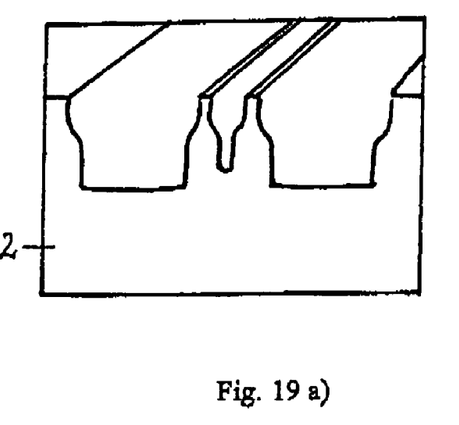
FIG. 19 two structures made in silicon with a Y-shaped etching profile

Micro-fluidic devices contain frequently channel systems and nozzles, where the channel systems and nozzles are generated by corresponding structuring of silicon substrates. Increasingly the requirement exists in this context to realize structures with complex lateral forms and vertical forms. This contains amongst others the generation of structures with composed etching profile all of etching profiles with alternating slope angle. Examples for this are shown in FIGS. 19a) and b).

Embodiment 3

Figure 20:
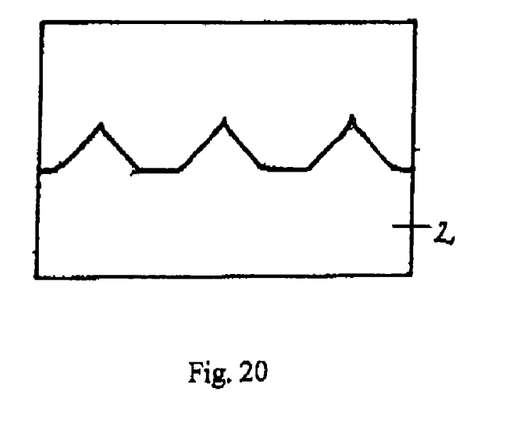
FIG. 20 a silicon structure for liquid storage cells

Storage sells for liquids can for example have a shape as is the shown in FIG. 20. The schematically illustrated structures have also been generated by the method according to the present Invention.

Embodiment 4

Figure 21:
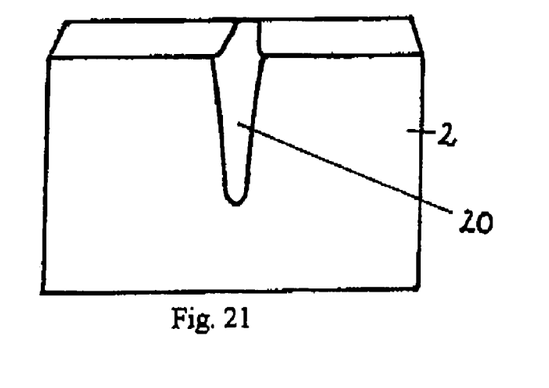
FIG. 21 a trench in silicon with slightly inclined side walls

Frequently the trenches 20 are etched into silicon in the context of the production of devices of the power electronics, wherein the trenches are in the following covered with dielectrics or, respectively, are filled with metals. Capacitors or vias contacts are to be generated in this manner. The homogeneous coating and void free filling of the trenches is alleviated, if the slope angle is disposed between 85 and 88 degrees. FIG. 21 shows an example for such a trench 20.

Embodiment 5

Figure 22:
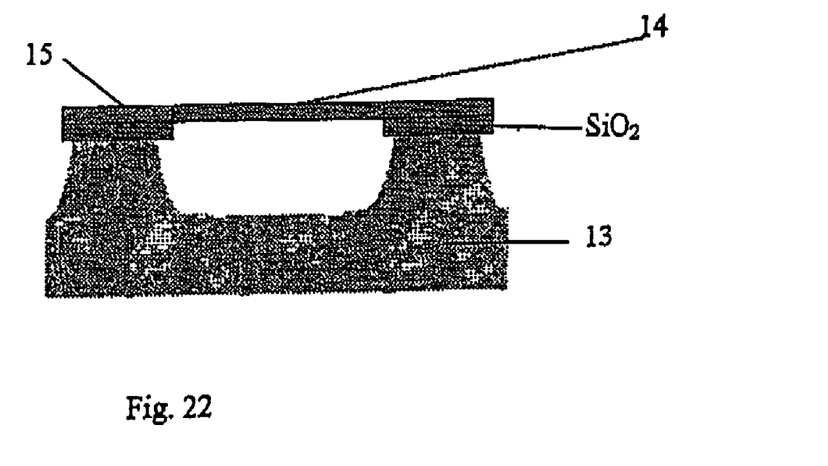
FIG. 22 a metal bridge structure on silicon

Special metal bridge structures on silicon are required in the field of electron microscopy. A free metal bridge 14, which is connected to contact pads 15 can be generated on the silicon substrate 13 for such a case (FIG. 22).

Figure 23:
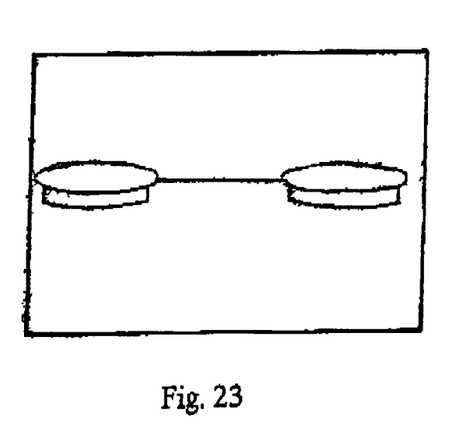
FIG. 23 a Cu-bridge structure, produced by way of the PPE-process
Figure 24:
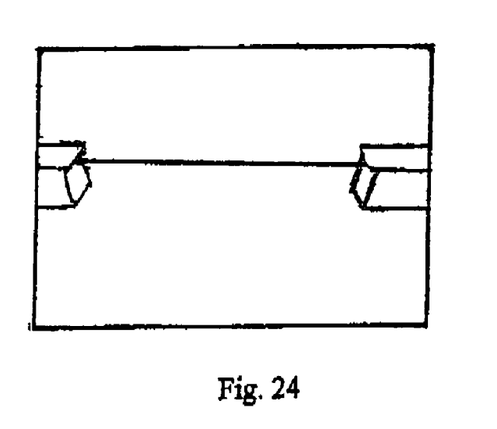
FIG. 24 a Cu-bridge laid bare

The laying bare of such metal bridges 14 represents up to now a problem for the silicon structuring. On the one hand the silicon on the backside of the metal strip is to be completely removed up to an etching depth of from 200 up to 500 micrometers, and on the other hand a minimum under etching of the SiO₂ under the contact pads 15 is desired. Despite miniaturization of the device element, the stability of the structure should therewith remain assured. The FIGS. 23 and 24 show structures of this kind realizable with the Invention method.

LIST OF REFERENCE NUMERALS

1—load lock
2—silicon wafer
3—mechanical clamping
4—rotary pump
5—turbo molecular pump
6—ICP-plasma source
7—gas inlet port
8—matching unit
9—high frequency generator
10—etching mask
11—polymer
12—course of the etching front
13—silicon substrate
14—metal bridge
15—contact pat
16—structure after iso-tropic etching
17—structure with vertical side walls
18—vertical side walls
19—positive etching profile
20—trench
21—converging side walls
22—etched bottom
23—plasma etching plant
24—substrate electrode
25—SF6-plasma
26—alternating deposition an etching steps SF6-plasma and C4F8-plasma
27—O2-plasma
Z—time ratio
$t_{isotropic}$—interval duration of the isotropic etching step
$t_{anisotropic}$—interval duration of the anisotropic etching step

TABLE 1

| | STEPS | | |
|---|---|---|---|
| a) | b) | | c) |
| | FUNCTION | | |
| | VERTICAL SILICON ETCHING | | |
| ISOTROPIC SILICON ETCHING | POLYMER DE-POSITION | SILICON ETCHING | POLYMER REMOVAL |
| PROCESS GASES | 130 sccm SF₆ | 85 sccm C₄F₈ | 130 sccm SF₆ | 60 sccm O₂ |
| PROCESS GAS PRESSURE | 4 Pa | 1, 3 Pa | 2, 7 Pa | 2 Pa |
| ICP-POWER | 600 w | 600 w | 600 w | 600 w |
| HF-POWER AT SUBSTRATE ELECTRODE | 12 w | — | 12 w | 12 w |
| CONSTANT INTERVAL TIME | | 5 s | 8 s | |

TABLE 2

| | STEP b) after DE 42 41 045 Cl | | STEP b) according to invention procedure | |
|---|---|---|---|---|
| PARAMETER | POLYMER DEPOSITION | SILICON ETCHING | POLYMER DEPOSITION | SILICON ETCHING |
| PROCESS GASES | 85 sccm C₄F₈ | 130 sccm SF₆ | 85 sccm C₄F₈ | 130 sccm SF₆ |
| PROCESS GAS PRESSURE | 2, 7 Pa | 5, 3 Pa | 1, 3 Pa | 2, 7 Pa |
| ICP POWER | 600 w | 600 w | 600 w | 600 w |
| HF POWER AT SUBSTRATE ELECTRODE | — | 12 w | — | 12 w |
| CONSTANT INTERVAL TIME | 8 s | 12 s | 5 s | 8 s |

The invention claimed is:

1. Method for structuring of silicon substrates for microsystem technological device elements, wherein the silicon substrate is covered with an etching mask and wherein the structures are furnished with a predetermined etching profile in the micrometer region with side walls and an etching depth At, wherein for the generation of a predetermined positive etching profile, the side walls of the structures are furnished with the defined slope angle β of from 60 degrees to 88 degrees relative to the etching bottom and the structures are generated with an etching depth At in the micrometer region, wherein a) initially an isotropic etching is performed such that a mask under etching u is generated, wherein the mask under etching u is formed approximately equal to the etching depth At, b) in the following the etching depth At is increased in an anisotropic etching in one process with alternatingly successively following etching and polymerization steps, such that the mask under etching u remains constant and such that the etching front of the etching profile obtains a new course, wherein the side walls of the structure are covered with a polymer, c) whereupon the polymer is removed at the side walls of the structure with an O2-plasma, and d) the isotropic etching of the step a), the anisotropic etching of the step b) and the removal of the polymer of the step c) are repeated as many times until the predetermined positive etching profile is obtained, e) wherein the slope angle beta is determined in a positive etching profile by adjustment of a time ratio Z according to the equation $$Z = \frac{t_{isotropic}}{t_{anisotropic}}$$

between the step of the isotropic etching according to step a) and the step of the anisotropic etching according to step b) is determined, wherein $t_{isotropic}$ represents the interval period of the isotropic etching step a) and wherein $t_{anisotropic}$ represents the interval period of the anisotropic etching step b).

2. The method according to claim 1 wherein the structures of the silicon substrate in the micrometer region are formed with an etching depth of at least ten micrometers to about 500 micrometers and more depending on the predetermined etching profile.

3. The method according to claim 1 wherein the silicon substrate is isotropic etched in the SF6-plasma.

4. The method according to claim 1 wherein an enlargement of the etching depth At is performed by an anisotropic etching process, wherein process gas pressures and interval times are decreased.

5. The method according to claim 4 wherein as selected the process gas pressures for the process gases amount from 1.0 to 5.3 Pa and wherein the interval times amount to 3 to 12 seconds.

6. The method according to claim 4 wherein the step of the increasing of the etching depth At by anisotropic etching with alternatingly and successively following etching steps and polymerization steps is extended with respect to time, wherein the mask under etching u remains constant and the etching front of the etching profile obtains a new course, wherein the side walls of the structure are covered with the polymer and wherein the time ratio Z is determined there from, wherein the time ratio is coordinated to a defined slope angle beta.

7. The method according to claim 1 wherein the step of the isotropic etching, during which step the mask under etching u is generated,
    wherein the mask under etching u is formed approximately equal to the etching depth At and wherein the time ratio Z is determined therefrom, wherein the time ratio Z is coordinated to the defined slope angle beta.

* * * * *